United States Patent [19]

Chevallier

[11] Patent Number: 5,764,568

[45] Date of Patent: Jun. 9, 1998

[54] METHOD FOR PERFORMING ANALOG OVER-PROGRAM AND UNDER-PROGRAM DETECTION FOR A MULTISTATE MEMORY CELL

[75] Inventor: Christophe J. Chevallier, Palo Alto, Calif.

[73] Assignee: Micron Quantum Devices, Inc., Santa Clara, Calif.

[21] Appl. No.: 736,568

[22] Filed: Oct. 24, 1996

[51] Int. Cl.⁶ ................................................. G11C 7/00
[52] U.S. Cl. ........................ 365/185.03; 365/185.22; 365/185.19; 365/185.24
[58] Field of Search ................ 365/185.22, 185.19, 365/185.24, 185.03

[56] References Cited

U.S. PATENT DOCUMENTS 5,321,699  6/1994  Endoh et al. .................... 365/185.22
5,570,315  10/1996  Tanaka et al. .................... 365/185.22

*Primary Examiner*—Vu A. Le
*Attorney, Agent, or Firm*—Limbach & Limbach L.L.P.

[57] ABSTRACT

A method for detecting an under-programming or over-programming condition in a multistate memory cell. The method uses three sense amplifiers, each with an associated reference cell which produces a reference voltage for input to each of the sense amplifiers. Control circuitry is used which allows the reference cell currents to be varied to produce the reference voltages or pairs of reference voltages needed to accurately determine the threshold voltage and hence state of a programmed or erased memory cell. This information is used by a controller to determine if a memory cell has been over-programmed, under-programmed, or properly programmed. If the cell has not been properly programmed, then additional programming pulses are applied (in the case of under-programming) or an error flag is set and the programming algorithm is terminated (in the case of an over-programmed cell).

38 Claims, 5 Drawing Sheets

METHOD FOR PERFORMING ANALOG OVER-PROGRAM AND UNDER-PROGRAM DETECTION FOR A MULTISTATE MEMORY CELL

TECHNICAL FIELD

The present invention relates to non-volatile memory systems, and more specifically, to a method for determining whether a multistate memory cell contained in such a system has been properly programmed by detecting an over-programmed or under-programmed condition.

BACKGROUND OF THE INVENTION

In conventional single-bit per cell memory devices, the memory cell assumes one of two information storage states, either an "on" state or an "off" state. The binary condition of "on" or "off" defines one bit of information. As a result, a memory device capable of storing n-bits of data requires (n) separate memory cells.

Increasing the number of bits which can be stored using single-bit per cell memory devices depends upon increasing the number of memory cells on a one-for-one basis with the number of bits of data to be stored. Methods for increasing the number of memory bits stored in a memory device composed of single-bit capacity cells have relied upon manufacturing larger die which contain more memory cells or using improved photolithography techniques to build smaller memory cells. Reducing the size of a memory cell allows more cells to be placed on a given area of a single die.

An alternative to single-bit per cell designs is the storage of multiple-bits of data in a single memory cell. One type of memory in which this approach has been followed is an electrically erasable and programmable device known as a flash memory cell. In flash cells, programming is carried out by applying appropriate voltages to the source, drain, and control gate of the device for an appropriate time period. This causes electrons to tunnel or be injected from a channel region to a floating gate. The amount of charge residing on the floating gate determines the voltage required on the control gate to cause the device to conduct current between the source and drain regions. This voltage is termed the threshold voltage, $V_t$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at the given set of applied voltages, the state of the cell (programmed or erased) can be found.

A multi-bit or multistate flash memory cell is produced by creating multiple, distinct threshold voltage levels within the device. Each distinct threshold voltage level corresponds to a value of a set of data bits, with the number of bits representing the amount of data which can be stored in the multistate cell. This method allows multiple bits of binary data to be stored within the same memory cell. When reading the state of the memory cell, the threshold voltage value or range of values for which the memory cell conducts current (as determined by comparison with a sense amplifier having a preselected reference value) corresponds to a binary decoded value representing the programmed data. The threshold voltage level for which the cell conducts thus corresponds to a bit set representing the data programmed into the cell. Proper data storage requires that the multiple threshold voltage levels of a multistate memory cell be separated from each other by a sufficient amount so that a level of a cell can be programmed or erased in an unambiguous manner. As noted, the specific relationship between the data programmed into the memory cell and the threshold voltage levels of the cell depends upon the data encoding scheme adopted for the cells.

In programming a multistate memory cell, the objective is to apply a programming voltage over a proper time period to store enough charge in the floating gate to move the cell's threshold voltage to a desired level. This level represents a state of the cell corresponding to an encoding of the data which is to be programmed into the cell.

However, division of the threshold voltage range for a two state (one bit) cell into multiple threshold voltage levels reduces the margin (threshold voltage difference) between levels. This necessitates tighter system design tolerances and reduced programming verification noise margins so that adjacent levels can be differentiated and programming errors (over-programming or under-programming of a cell) reduced.

It is necessary to be able to program multiple bits (and as a result, multiple memory cells) at the same time in order to produce a commercially desirable memory system which can be programmed within a reasonable amount of time. However, a problem arises when a number of bits are to be programmed at the same time. This is because the characteristics of each bit are different (due to minor variations in the structure and operation of the semiconductor devices which comprise the memory cells), so that variations in the programming speed of different cells will typically occur. This results in bits that become programmed faster than others, and the possibility that some bits will be programmed to a different state (the cell will be programmed to a different threshold voltage level) than intended.

As noted, fast programming of multiple memory cells can result in undershooting or overshooting the desired threshold voltage level of some cells, producing an error in the data being stored. In some flash memory systems, this problem can remain unknown and result in a long (and unproductive) programming cycle. In the case of overshooting the threshold voltage range, a standard memory system would continue programming the cells, which would serve to increase the over-shoot. This can occur because the memory system is controlled to carry out the programming operation until the programming data compares with the data applied or a maximum pulse number, voltage, and programming time occur before it aborts and sets an error flag (or performs the programming operation at an alternate storage location). In mass storage systems where programming speed is a key performance criteria and lengthy re-programming and erase operations are not desirable, a method for detecting and handling improper programming (under or over-programming) of bits during programming operations would be more efficient.

What is desired is a method of detecting an under-programming or over-programming condition in a multistate memory cell in order to properly and efficiently program the cell.

SUMMARY OF THE INVENTION

The present invention is directed to a method for detecting an under-programming or over-programming condition in a multistate memory cell. The method uses three sense amplifiers, each with an associated reference cell which produces a reference voltage for input to each of the sense amplifiers. Control circuitry is used which allows the reference cell currents to be varied to produce the reference voltages or pairs of reference voltages needed to accurately determine the threshold voltage and hence state of a programmed or erased memory cell. This information is used by a controller to determine if a memory cell has been over-programmed, under-programmed, or properly programmed. If the cell has not been properly programmed, then additional programming pulses are applied (in the case of under-programming) or an error flag is set and the programming algorithm is terminated (in the case of an over-programmed cell).

Further objects and advantages of the present invention will become apparent from the following detailed description and accompanying drawings.

DETAILED DESCRIPTION OF THE INVENTION

Figure 1:
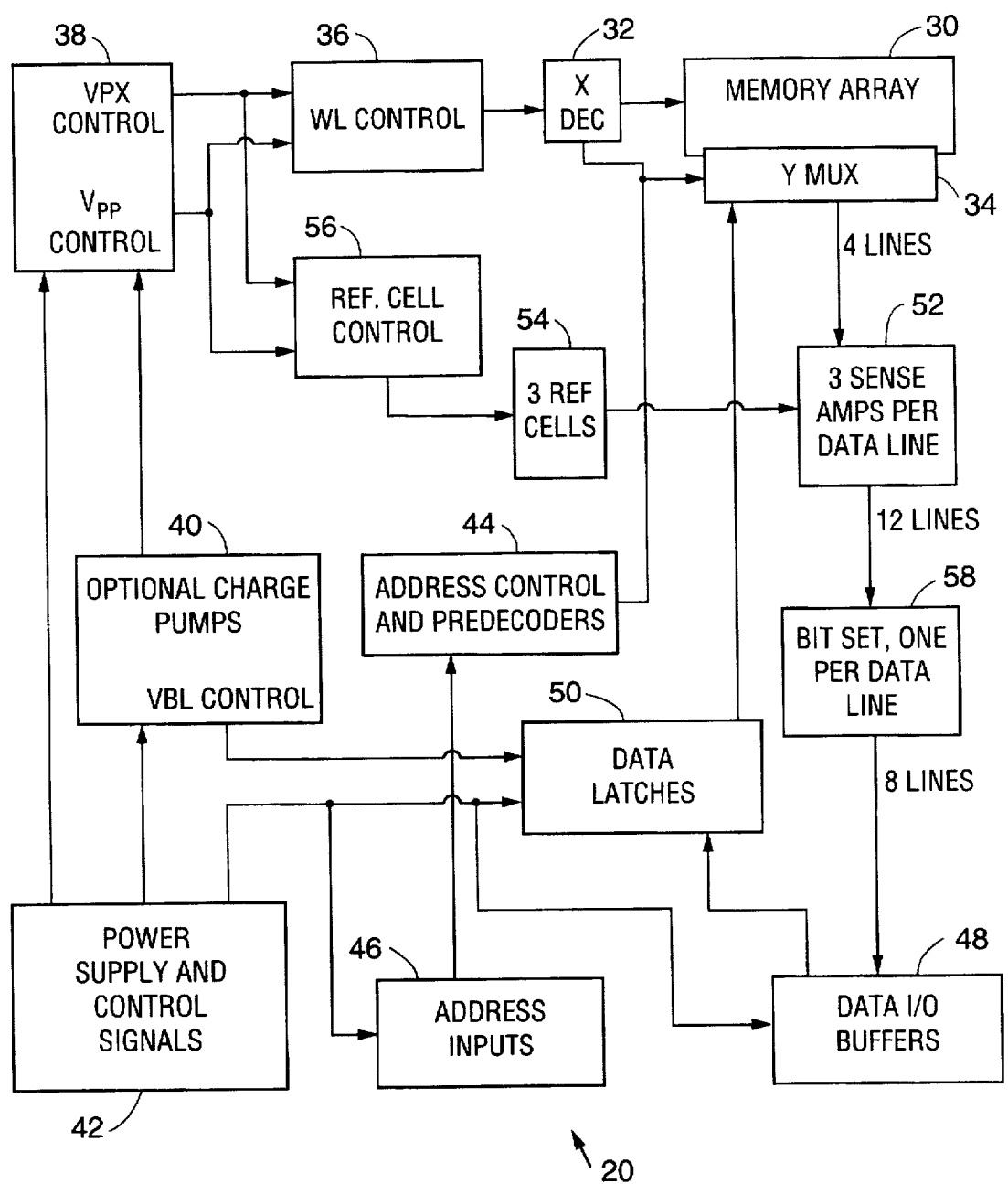
FIG. 1 is a block diagram showing the primary functional units of a memory system incorporating circuitry for implementing the memory cell over-programming and under-programming detection method of the present invention.

FIG. 1 is a block diagram showing the primary functional units of a memory system 20 incorporating circuitry for implementing the memory cell over-programming and under-programming detection method of the present invention. The central component of memory system 20 is memory array 30 which consists of a plurality of memory cells arranged into rows and columns. The rows are referred to as "word lines" and the columns are referred to as "bit lines".

X-decoder block 32 contains circuitry which decodes data representing an address of a memory cell within memory array 30 and applies the proper voltage for the memory system operation to the word line corresponding to the row in which the memory cell is located. Similarly, Y-multiplexer block 34 contains circuitry which decodes the address of the memory cell within memory array 30 and applies the proper voltage for the memory system operation to the bit line corresponding to the column in which the memory cell is located.

Word line control block 36 (labelled "WL control" in the figure) contains circuitry which permits a precise adjustment of the voltage applied to a word line during the various memory system operations. A circuit suited for use in controlling the word line voltages is described in the commonly assigned U.S. patent application Ser. No. 08/640,456, filed May 1, 1996, and entitled "OP Amp Circuit With Variable Resistance and Memory System Including Same", the contents of which are hereby incorporated by reference.

Vpp (write/erase supply voltage) and VPX (word line voltage) control block 38 contains circuitry for generating and/or controlling the voltages used for the word lines and other elements of the memory system during programming and erase operations. In some cases these voltages may be produced by a charge pump 40 which generates the voltage from a supply voltage supplied by power supply 42. Charge pump block 40 also contains circuitry for controlling the voltages applied to bit lines of the memory array (labelled "VBL" in the figure) during programming operations.

Address control and predecoder block 44 contains circuitry which produces the address of a memory cell based on data or signals supplied by address input block 46, after generating intermediate signals used to drive x-decoder 32 and y-multiplexer 34.

Data I/O buffer block 48 contains buffer circuitry used to receive input data supplied from an external source to memory system 20 during a programming operation, or to output data during a read operation. Data latches 50 are used to store and buffer input data during a programming operation. A state machine (not shown) is typically used to control the sequencing of the stages of the operations performed on the cells contained in memory array 30.

During a read operation, three sense amplifiers 52 (in the case of a two bit - four state cell) are used in conjunction with the reference voltages supplied by three reference cells 54 to determine the state of a memory cell contained in memory array 30. In a typical form of sense amplifiers 52, a signal from a selected memory cell and from one of reference cells 54 is compared using a differential amplifier. The combined outputs of sense amplifiers 52 indicate the voltage range within which the threshold voltage of the memory cell falls. This is converted to a bit set representing the cell's state. Note that for a general case of a memory cell storing $2^n$ bits of data, $2^n-1$ sense amplifiers and $2^n-1$ reference cells would be used.

Reference cells 54 are typically implemented in the form of memory cells of the type found in array 30. Reference cells 54 may also take the form of single state memory cells. Reference cell control block 56 contains circuitry used to control the reference voltage supplied by cells 54 and input to each of the sense amplifiers. This enables the reference voltage(s) to be varied in accordance with the requirements of the memory system operation being implemented. A description of circuitry suitable for use in implementing reference cell control block 56 is disclosed in the commonly assigned U.S. patent application entitled "Apparatus for Reading State of Multistate Non-volatile Memory Cells", application Ser. No. 08/736,194, filed Oct. 24, 1996, the contents of which are hereby incorporated by reference. As noted, the output of sense amplifiers 52 is supplied to sense amplifier logic block 58 (labelled "bit set" in the figure) which determines the bit values corresponding to the sensed state of the memory cell, and allows the outputs of the sense amplifiers to be encoded into a set of two bits of data.

As has been discussed, each of the threshold voltage levels in a multistate memory cell corresponds to a different state of the cell. Each state in turn is represented by a logic value or bit set having one of four values (for a two bit, four level multistate cell). The precise logic value corresponding to any particular threshold voltage value depends on the encoding scheme chosen for the data to be programmed into the memory cells. An example of an encoding scheme, including the logic values, the corresponding threshold voltage values (cell $V_t$), and the state of the memory cell is shown in Table 1.

TABLE 1

| Cell $V_t$ | State | logic value (bit set) |
|---|---|---|
| less than 3 V | erased | 1 1 |
| 4 to 4.5 V | programmed state A | 1 0 |
| 5 to 5.5 V | programmed state B | 0 0 |
| greater than 6 V | programmed state C | 0 1 |

As shown in the table, a multistate cell in which two bits are used to define each state will have four possible states or threshold voltage levels. In contrast, a standard one bit memory cell will have only two possible states or threshold voltage levels. Thus, in a memory cell storing only one bit of data, it is much easier to precisely determine the state of the cell. This is because there is significantly more margin for error allowed when determining the cell's threshold voltage value.

To ensure that a memory cell is properly programmed, i.e., has a threshold voltage level within a specified range of $V_t$ values, it is necessary to check that the cell's $V_t$ is above a certain value and below a second value, with the two values defining the $V_t$ range depending upon the memory system operation (read, program verification, etc.) being implemented. Although a memory cell is expected to have a certain $V_t$ value when read, in order to trip the sense amplifiers in a reproducible way, the cell is programmed and verified at a slightly higher $V_t$ value. This allows for variations in the cell threshold voltage level over time due to oxide leakage or disturbs arising from the programming or reading of adjacent cells.

For example, based on the previously discussed encoding scheme, the bit set "1 0" should be attributed to a memory cell having a $V_t$ between 4.0 and 4.5 volts soon after being programmed. This corresponds to what is termed a "programming verify" operation. The circuitry for determining the state of a multistate memory cell would check whether the cell's $V_t$ was both above 4.0 volts and below 4.5 volts. This verifies that the programming operation was correctly carried out.

However, after time the $V_t$ value may shift slightly, so that its threshold voltage may be above 4.5 volts or below 4.0 volts. Thus, when performing a "read" operation at this later time, it is beneficial to allow the range of $V_t$ values corresponding to the state "1 0" to vary somewhat, as long as the states of the cell can still be determined unambiguously. In the case being discussed, the $V_t$ trip point values (which define the limits of the range of $V_t$ for which the cell is in the state represented by the range) would bet set to 3.7 volts and 4.7 volts.

This example can be extended to determine all of the possible bit set values for a multistate memory cell containing two bits (four $V_t$ levels). In such a case, the sensing circuitry needs to be capable of producing and setting the following reference voltage values (trip points): 3.0, 3.7, 4.0, 4.5, 4.7, 5.0, 5.5, 5.7, and 6.0 volts. Note that this set of values corresponds to the data encoding scheme for a two-bit cell described previously with regards to Table 1, with an allowed threshold voltage variance during a read operation of −0.3 and +0.2 volts. Thus, during a read operation, reference cells 54 are controlled to produce 3.7, 4.7, and 5.7 volts as the reference voltages. This enables a determination of whether the memory cell threshold voltage is below 3.7 volts (corresponding to a bit set of 1 1), between 3.7 and 4.7 volts (corresponding to a bit set of 1 0), between 4.7 and 5.7 volts (corresponding to a bit set of 0 0), or over 5.7 volts (corresponding to a bit set of 0 1). The present invention may be applied to memory cells having different encoding schemes, encoding schemes for cells containing a greater number of bits, and/or different allowed voltage shifts during a read operation.

During an over-programming verification operation, reference cells 54 are controlled in a manner such that they produce 3.5, 4.5, and 5.5 volts as the reference voltages. Each of the three reference voltages is provided as an input to one of three sense amplifiers 52. The outputs of sense amplifiers 52 are analyzed to determine whether the cell's threshold voltage is below 3.5 volts (corresponding to a bit set of 1 1), between 3.5 and 4.5 volts (corresponding to a bit set of 1 0), between 4.5 and 5.5 volts (corresponding to a bit set of 0 0), or over 5.5 volts (corresponding to a bit set of 0 1), where each of the corresponding bit sets is based on the encoding scheme of Table 1.

During an under-programming verification operation, reference cells 54 are controlled in a manner such that they produce 4.0, 5.0, and 6.0 volts as the reference voltages. Each of the three reference voltages is provided as an input to one of three sense amplifiers 52. The outputs of sense amplifiers 52 are analyzed to determine whether the cell's threshold voltage is below 4.0 volts (corresponding to a bit set of 1 1), between 4.0 and 5.0 volts (corresponding to a bit set of 1 0), between 5.0 and 6.0 volts (corresponding to a bit set of 0 0), or over 6.0 volts (corresponding to a bit set of 0 1), where each of the corresponding bit sets is based on the encoding scheme of Table 1.

Combining the results of both the over and under-programming verification operations allows a determination of whether the cell's threshold voltage level is below 3.5 volts, between 3.5 and 4.0 volts, between 4.0 and 4.5 volts, between 4.5 and 5.0 volts, between 5.0 and 5.5 volts, between 5.5 and 6.0 volts, or over 6.0 volts. This allows a determination of whether the memory cell is under-programmed relative to a specific state, over-programmed relative to a specific state, or properly programmed.

Based on the encoding scheme and $V_t$ values shown in Table 1, a correspondence between the bit set obtained during a read, an under-program verify, and an over-program verify operation and the cell status can be established. Table 2 shows the cell threshold voltage level $V_t$), bits sets, and the cell status (over-programmed, under-programmed, properly programmed).

TABLE 2

| Cell $V_t$ | Bit Set Value (read) | Bit Set Value (under-program verify) | Bit Set Value (over-program verify) | Cell Status |
|---|---|---|---|---|
| over 6 V | 0 1 | 0 1 | 0 1 | valid 01 |
| 5.7–6 V | 0 1 | 0 0 | 0 1 | under-program 0 1 |
| 5.5–5.7 | 0 0 | 0 0 | 0 1 | over-program 0 0 |
| 5.0–5.5 | 0 0 | 0 0 | 0 0 | valid 00 |
| 4.7–5.0 | 0 0 | 1 0 | 0 0 | under- |

TABLE 2-continued

| Cell $V_t$ | Bit Set Value (read) | Bit Set Value (under-program verify) | Bit Set Value (over-program verify) | Cell Status |
|---|---|---|---|---|
| | | | | program 0 0 |
| 4.5–4.7 | 1 0 | 1 0 | 0 0 | over-program 1 0 |
| 4.0–4.5 | 1 0 | 1 0 | 1 0 | valid 10 |
| 3.7–4.0 | 1 0 | 1 1 | 1 0 | under-program 1 0 |
| 3.5–3.7 | 1 1 | 1 1 | 1 0 | under-program 1 0 |
| 3.0–3.5 | 1 1 | 1 1 | 1 1 | under-program 1 0 |
| below 3 V | 1 1 | 1 1 | 1 1 | valid 11 |

Examples of how to interpret the Table 2 entries will now be given. Assume a memory cell is in the erased state (corresponding to a bit set value of 1 1), and it is desired to program the cell to the state (1 0), which corresponds to a $V_t$ level between 4.0 and 4.5 volts. Further assume that after a first programming pulse, the cell $V_t$ is raised to 3.7 V. An under-programming verify (UPV) operation is then performed. As determined by reference to Table 1, the bit set resulting from the UPV operation is (1 1). An over-programming verify (OPV) operation (OPV) is then performed. The bit set resulting from the OPV operation is (1 0). As seen from Table 2, this data indicates that the memory cell is under-programmed. A second programming pulse is then applied. Assume that this second pulse causes the cell $V_t$ to move to 4.1 V. The UPV operation will now produce a bit set of (1 0). The OPV operation will also produce a bit set of (1 0). Table 2 now indicates that the cell is properly programmed.

As a second example, consider a situation in which a memory cell has been programmed to have a $V_t$ level of 4.1 V, and it is desired to program the cell to a $V_t$ level corresponding to a state of (0 0). Assume that after a single programming pulse the $V_t$ is set to 5.6 V. In this situation, the UPV operation will produce a bit set of (0 0), and the OPV operation will produce a bit set of (0 1). As indicated by Table 2, this indicates that the memory cell is over-programmed.

As a third example, consider a situation in which a memory cell has been erased (corresponding to a state 1 1) and it is desired to program the cell to a state of (0 1). Assume that after one or more programming pulses, the cell $V_t$ is 5.4 V. An UPV operation will produce a bit set of (0 0), and the OPV operation will produce a bit set (0 0). As indicated by Table 2, this means that the memory cell is in a valid (0 0) state, which is under-programmed for a (0 1) state. Assume that after the next programming pulse the cell $V_t$ is 5.9 V. An UPV operation will produce a bit set of (0 0), and the OPV operation will produce a bit set (0 1). As indicated by Table 2, this means that the memory cell is still under-programmed. Now assume that after the next programming pulse the cell $V_t$ is 6.2 V. An UPV operation will produce a bit set of (0 1), and the OPV operation will produce a bit set (0 1). As indicated by Table 2, this means that the memory cell is properly programmed to a valid (0 1) state.

Figure 2:
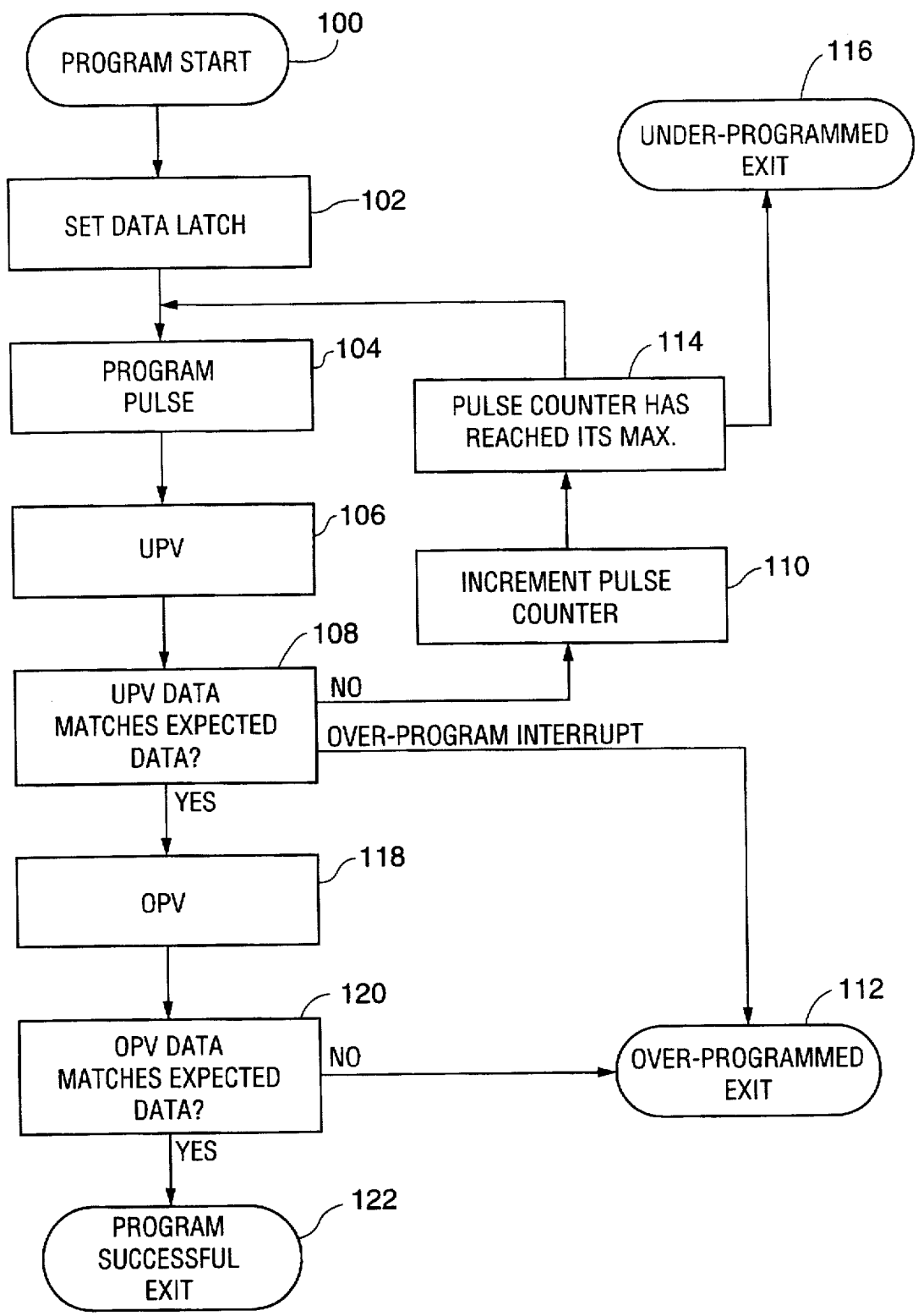
FIG. 2 is a flowchart showing the steps involved in applying the over-programming and under-programming detection method of the present invention to a single multi-state memory cell.

FIG. 2 is a flowchart showing the steps involved in applying the over-programming and under-programming detection methods of the present invention to a single multi-state memory cell. As shown in the figure, the process begins with a program start command (box 100). A data latch is loaded with a level such that the selected bit line (corresponding to the memory cell to be programmed) will go high to the VBL level during a programming pulse (box 102). This applies the programming voltage to the selected memory cell.

A programming pulse is then applied to the selected cell (box 104). An under-programming verify (UPV) operation is then performed (box 106). The result of the UPV operation (the bit set) is then analyzed by a controller. The controller performs a data matching operation which consists of a compare operation and an over-programming detection operation (box 108). The compare operation is a logic value compare on the two bits of the bit set which compares the expected data (that intended to be programmed into the cell) to the bit set resulting from the UPV operation. The over-program detection (not to be confused with the over-program verification operation) is a logic operation performed by the system controller. The over-program detection operation checks if the read data (which corresponds to a threshold voltage as determined in accordance with Table 1) is above the intended data. The use of the over-program detection operation will be described in greater detail below. If the compare fails, a pulse counter is incremented (box 110) and a second programming pulse is applied to the memory cell. The compare operation is then performed again. Simultaneously with the compare operation, the over-program detection operation is executed. If the intended data successfully compares to the UPV bit set, then the over-program verification operation (box 118) is performed. Referring to Table 2, note that it is possible for the intended data and UPV bit set to successfully compare while the memory cell threshold voltage is above the range corresponding to the desired programming state shown in Table 1. Therefore, an over-program verification operation is needed to guarantee that the cell's threshold voltage is within the valid range for the intended state. If the over-program verification operation indicates the cell is over-programmed, then an error signal is produced which generates an interrupt which halts the programming process. This terminates the programming operation (over-programmed exit - box 112).

If the memory cell is defective, then it is possible that it will not be capable of being programmed no matter how many programming pulses are applied. In such a situation, the memory system could become locked into an infinite loop. To prevent this problem, the number of programming pulses applied to the cell is counted by a pulse counter. Each time a pulse is applied, the pulse counter value is checked. When the pulse counter reaches a pre-determined maximum value (box 114), the programming process is stopped and a signal is produced which indicates that the programming operation has failed with the cell in an under-programmed state (box 116).

As noted, the data matching operation is more than just a compare operation. If the bit set resulting from the UPV operation is simply compared to the intended data, then the result indicates that the cell $V_t$ is either within a certain test $V_t$ range or outside of that range. If it is outside of the range, it could be below the range or above it. If the cell $V_t$ is inside the test range, it could still be outside of the range corresponding to the desired programming state. If the cell $V_t$ is above the test range or outside of the range corresponding to the desired state, then the cell is over-programmed. In such a case, applying programming pulses will not solve the problem and will waste time since the programming pulses will be applied until the maximum pulse counter value is reached. To prevent this problem, the over-program detection circuit is used. This circuit detects if the cell $V_t$ indicates a programming state above that of the intended data. The over-program detection operation is implemented by a circuit (or look up table) which has as inputs a bit set representing the data intended to be programmed into the selected memory cell and the bit set resulting from the UPV operation. The output of the circuit (or look up table) is a signal indicative of whether the memory cell is over-programmed. A suitable over-program detection circuit for use in the method of the present invention is disclosed in the commonly assigned U.S. patent application entitled, "Apparatus and Method for Detecting Over-Programming Condition in Multistate Memory Device", Attorney Docket MCRN-F2800, filed the same day as this application and the contents of which is hereby incorporated by reference.

If the result of the UPV data matching operation(s) (the data compare and over-program detection) shows that the memory cell is not under-programmed, then an over-programming verify (OPV) operation is performed (box 118). The result of the OPV operation is processed in a data matching operation (box 120). As is the case with the UPV data matching operation, the OPV data matching is a two stage operation consisting of data compare and over-program detection operations. In the case of the OPV data matching, the data intended to be programmed is compared with the bit set resulting from the OPV operation. If the OPV operation indicates that the cell is over-programmed, then the programming operation is ended with an over-programmed signal being issued (box 112). If the OPV operation does not indicate an over-programmed cell, then the programming operation is ended with a successful programming signal being issued (box 122).

The data matching operation which is part of the OPV operation could be implemented as a simple logic data compare operation. This is because an over-program detection interrupt is not needed. However, the system controller generally uses the same circuitry for the UPV and OPV operations, with the difference being the control parameters sent to the memory which are used to adjust the reference inputs for the sense amplifiers. Thus, the OPV data matching issues both a data match status and an interrupt if the data is over-programmed. Since when the OPV operation is performed the memory cell has been programmed enough (as indicated by a successful UPV operation), the cell can only fail the OPV data matching if it is over-programmed. Therefore, at this stage of the programming method, an OPV data matching failure is logically equivalent to an over-program detection interrupt. Thus, either output (data matching status or interrupt) can be used to end the programming method (box 112).

As an example of the method shown in FIG. 2, if it was desired to program a cell to a "0 0" level, the cell $V_t$ should be between 5.0 and 5.5 V. After a first programming pulse, assume the cell has a $V_t$ of 4.1 V. As seen from Table 2, an UPV operation will produce a bit set of (1 0). This is not the desired (0 0) state, so the data compare operation will fail and exit the programming operation. The controller than increments the pulse counter by one. If the pulse counter has not reached its maximum value (typically 25 pulses), a new programming pulse is applied. Assume that this time the cell $V_t$ reaches 5.6 V. The UPV operation now produces (0 0) as the bit set. The data compare operation is successful and there is no over-programming detection operation. This is followed by an OPV operation. The OPV operation produces (0 1) as the bit set. The data compare operations fails and the over-program detection operation triggers an interrupt since the state (0 1) is above (0 0). The programming operation is terminated with issuance of an over-programmed signal.

Figure 3:
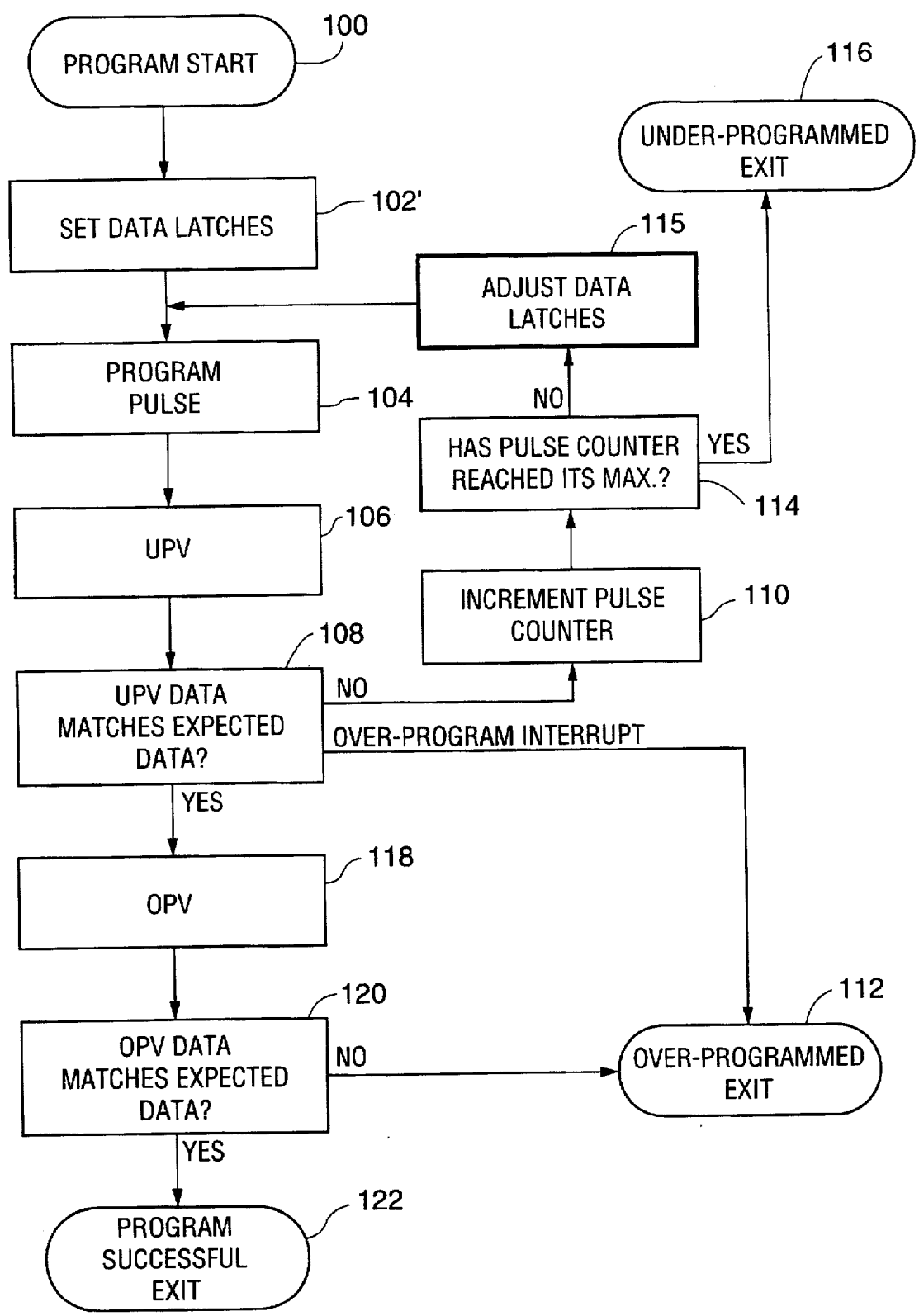
FIG. 3 is a flowchart showing the steps involved in applying the over-programming and under-programming detection method of the present invention to more than one multi-state memory cell.

FIG. 3 is a flowchart showing the steps involved in applying the over-programming and under-programming detection methods of the present invention to more than one multi-state memory cell. This multi-cell programming method is similar to the single cell method of FIG. 2 except that prior to applying a new programming pulse to the cells, the data in the data latches is adjusted so that the cells that have been programmed to the proper $V_t$ level do not get programmed any further.

As with the programming method shown in FIG. 2, the method of FIG. 3 begins with a program start command (box 100). The data latches for the cells being programmed are then loaded with a level such that the selected bit line (corresponding to the memory cell to be programmed) will go high to the VBL level during a programming pulse (box 102').

A programming pulse is then applied to each of the selected cells (box 104). An under-programming verify (UPV) operation is then performed (box 106). The result of the UPV operation (the bit set) is then analyzed by a controller. The controller performs a data matching operation which consists of a compare operation and an over-programming detection operation (box 108). Again, the compare operation is a logic value compare on the two bits of the bit set which compares the expected data (that intended to be programmed into each cell) to the bit set from the UPV operation. If the compare fails, a pulse counter is incremented (box 110) and a second programming pulse is applied to each of the memory cells. If the over-program detection operation indicates the cell is over-programmed, then an error signal is produced which generates an interrupt which halts the programming process. This terminates the programming operation (over-programmed exit - box 112).

As discussed with reference to FIG. 2, the number of programming pulses applied to each of the cells is counted by a pulse counter. Each time a pulse is applied, the pulse counter value is checked. When the pulse counter reaches a pre-determined maximum value (box 114), the programming process is stopped and a signal is produced which indicates that the programming operation has failed with the cells in an under-programmed state (box 116).

Prior to applying the new programming pulse to each memory cell, the contents of the data latches is adjusted to indicate those cells that have reached the proper $V_t$ level (box 115). This cycle continues until the data compare operation which is part of the UPV operation is satisfied for each memory cell. When the result of the UPV data matching operations (the data compare and over-program detection) shows that the memory cells are not under-programmed, then an OPV operation is performed (box 118). The result of the OPV operation is processed in a data matching operation (box 120). If this operation indicates that the cells are over-programmed, then the programming operation is ended with an over-programmed signal being issued (box 112). If the OPV operation does not indicate an over-programmed cell, then the programming operation is ended with a successful programming signal being issued (box 122).

The data latch adjustment step 115 of the FIG. 3 involves modifying the data in the latches to value(s) which indicate to the controller that no further programming of the memory cell corresponding to that latch is required. This is done by collapsing the data to values which represent instructions to the controller to either apply a programming pulse or refrain from applying a further pulse to the cell. An apparatus and method for performing the collapsing of the data read from the memory cells into the controller instruction data to be placed into the latches is described in U.S. patent application entitled, "Apparatus and Method for Programming Multistate Memory Device", Attorney MCRN-F1500, filed the same day as this application and the contents of which is hereby incorporated by reference.

In order to improve a memory system's performance when programming multistate memory cells, a variety of different programming methods have been suggested. The most simple method involves having each programming pulse be of the same short duration and/or fixed amplitude regardless of the state to which the memory cell is being programmed. Although this programming method is simple to implement it has the disadvantage that it necessitates the use of many programming pulses to reach all of the possible states. This implies the use of many programming verify cycles, and hence a longer programming time. Another method is to use a programming operation which has been optimized for programming a memory cell to each of the different states. This usually involves varying the programming pulse duration and/or amplitude depending upon the desired programming state of the cell.

Figure 4:
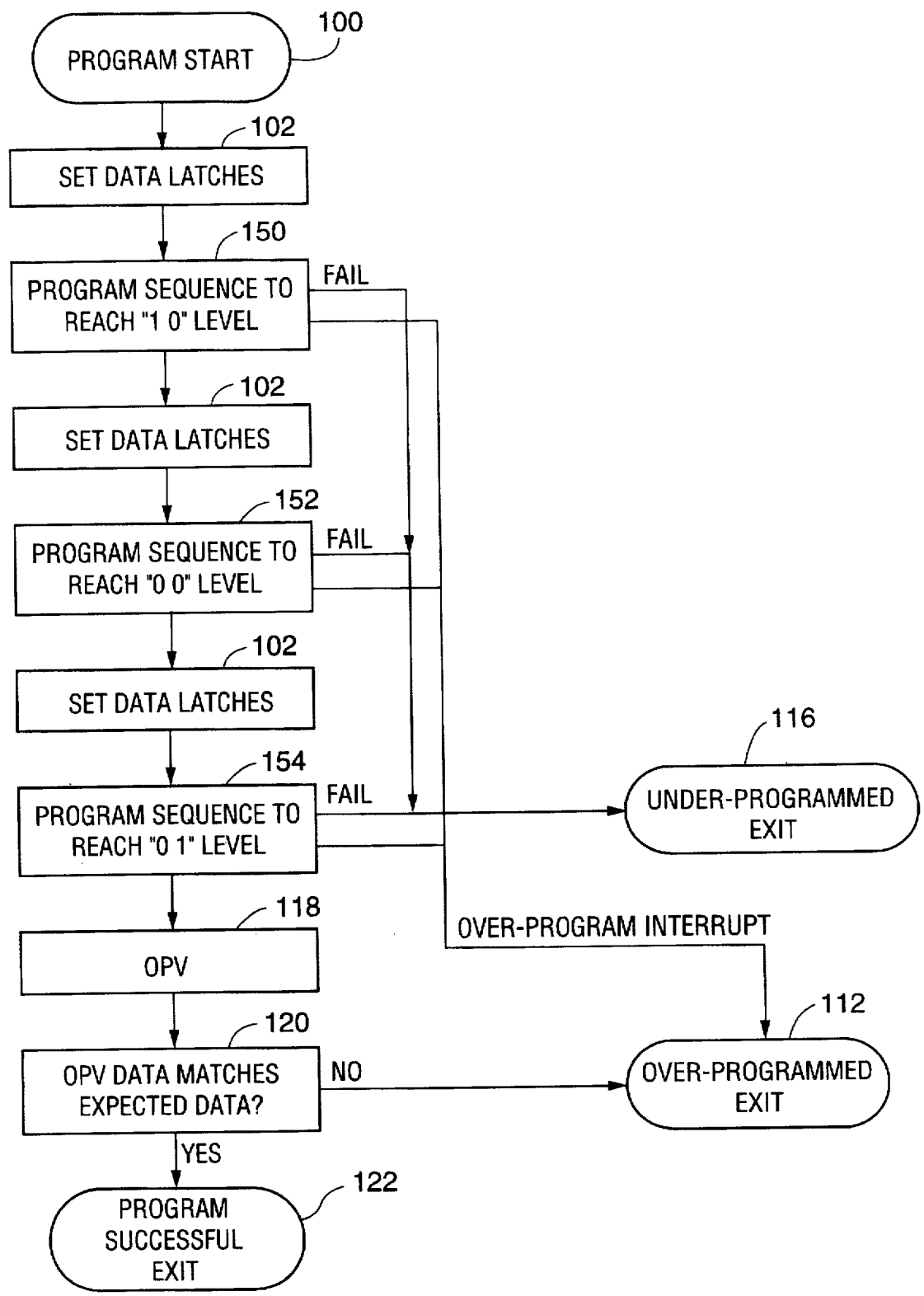
FIG. 4 is a flowchart showing the steps involved in applying the over-programming and under-programming detection method of the present invention to multi-state memory cells for the case in which the programming pulse characteristics are varied for the different states of the memory cells.

FIG. 4 is a flowchart showing the steps involved in applying the over-programming and under-programming detection method of the present invention to multi-state memory cells, for the case in which the programming pulse characteristics are varied for the different states of the memory cells. Each of the program sequence stages (labelled as boxes 150, 152, and 154 in the figure) represents the steps needed to properly program a memory cell to a specific state (either "1 0", "0 0", or "0 1", respectively). Prior to each programming sequence, the data latches are set with the appropriate values (boxes 102). After setting the data latches, the indicated programming sequence is performed. Each programming sequence (as indicated by boxes 150, 152, and 154) can terminate in one of three ways: (1) a situation in which all of the cells to be programmed are successfully programmed to the desired level; (2) an underprogrammed exit in which some of the cells cannot be programmed to the desired level; and (3) an overprogrammed exit in which some of the cells are programmed to a level which over-shoots the desired level.

If the programming sequence ends in an underprogrammed exit, the entire programming method is terminated at the stage represented by box 116 of FIG. 4. If the programming sequence ends in an over-programmed exit, the entire programming method is terminated at the stage represented by box 112 of FIG. 4. Otherwise, the programming method continues to the next step, either the stage represented by boxes 102 and 152, 102 and 154, or 118.

At the conclusion of each of the three (in this example) programming operations, an over-programming verify operation (box 118) is performed. The OPV operation is of the type previously described with reference to FIGS. 2 and 3. As before, an over-programming error causes the programming operation to be terminated (box 112).

As part of each of the three programming sequences represented by boxes 150, 152, and 154, the programming pulse(s) applied can be optimized for each of the sequences, or they can be varied depending upon the programming pulses applied within each sequence. For example, the first pulse applied in an attempt to program a cell to a "1 0" state may be of 7 volts on the gate and 10 microseconds in duration. Such a pulse would typically be expected to bring the memory cell's threshold voltage to close to the threshold voltage value representing the lower limit of the desired range. A second programming pulse of 7 volts on the gate and 3 microseconds in duration would then typically bring the cell's threshold voltage within the desired range without over-shooting it.

The programming pulse characteristics can also be varied depending upon whether all bits are incrementally programmed through each of the possible states until the desired state is reached, or the bits which are to be programmed to the higher threshold voltage levels are maintained in a low state until a later stage of the programming operation when pulses are applied. For example, if it is desired to program one cell to a "0 0" state and another cell to a "1 0" level, both cells can first be programmed to "1 0" level, with one cell then being programmed to the "0 0" state. Another method is to program one of the cells to the "1 0" level while leaving the other cell in the "1 1" state. After satisfactory programming of the first cell, the second cell is programmed to the "0 0" state using stronger programming pulses.

Figure 5:
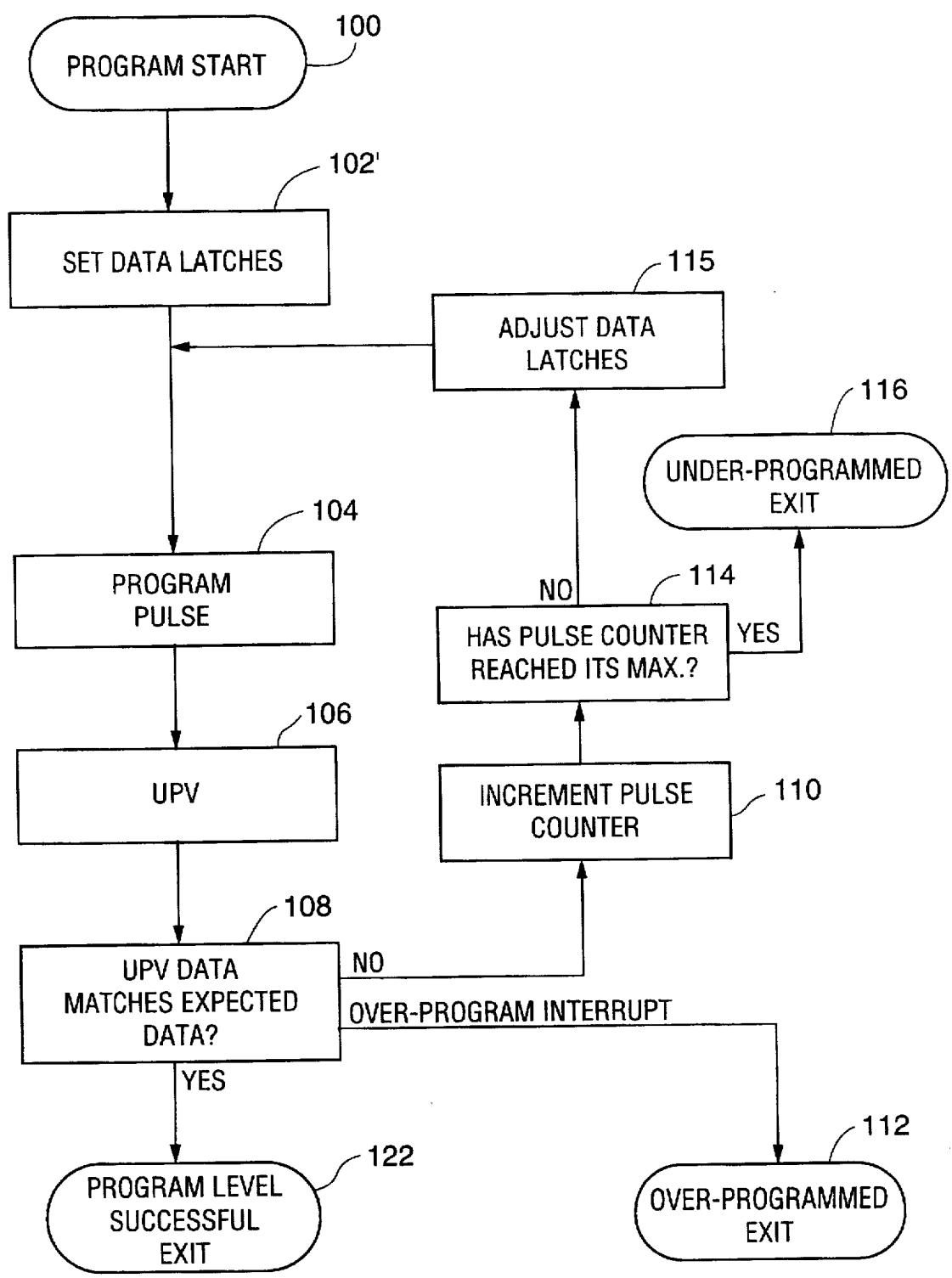
FIG. 5 is a flowchart showing the steps involved in applying the over-programming and under-programming detection method of the present invention to multi-state memory cells for the case of programming the cells to reach a specified threshold voltage level.

FIG. 5 is a flowchart showing the steps involved in applying the over-programming and under-programming detection method of the present invention to multi-state memory cells for the case of programming the cells to reach a specified threshold voltage level. The steps shown in FIG. 5 are examples of the stages of the programming sequences represented by boxes 150, 152, or 154 of FIG. 4. As indicated, the stages of the programming sequences are similar to those shown in FIG. 3 for programming a group of memory cells, except that the over-programming verify operation is performed at the end of the three programming sequences. The programming pulse(s) applied in box 104 of FIG. 5 would be optimized as discussed previously for the programming sequence being applied.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A method of programming a multistate memory cell to a desired state, comprising:

applying a programming pulse to the memory cell;

performing an under-programming verification operation on the memory cell to determine if the cell is underprogrammed relative to the desired state, wherein the step of performing an under-programming verification operation on the memory cell further comprises determining a first threshold voltage range which includes a threshold voltage corresponding to the desired state of the memory cell;

generating a first bit set representing the determined first threshold voltage range; and comparing the generated first bit set to data intended to be programmed into the memory cell, wherein the generated first bit set and data successfully compare when the memory cell is not under-programmed;

repeating the steps of applying a programming pulse to the memory cell and performing the underprogramming verification operation if the memory cell is under-programmed, until the memory cell is no longer under-programmed; and performing an over-programming verification operation on the memory cell to determine if the memory cell is over-programmed relative to the desired state.

2. The method of claim 1, wherein the step of performing an under-programming verification operation on the memory cell further comprises:

performing an over-program detection operation to determine if the memory cell has been over-programmed relative to the desired state.

3. The method of claim 1, wherein the step of performing an over-programming verification operation on the memory cell further comprises:

determining a second threshold voltage range which includes a threshold voltage corresponding to the desired state of the memory cell;

generating a second bit set representing the determined second threshold voltage range; and comparing the generated second bit set to data intended to be programmed into the memory cell, wherein the generated second bit set and data successfully compare when the memory cell is not over-programmed.

4. The method of claim 3, wherein the step of performing an over-programming verification operation on the memory cell further comprises:

performing an over-program detection operation to determine if the memory cell has been over-programmed relative to the desired state.

5. A method of programming a plurality of multistate memory cells to a respective plurality of desired states, comprising:

applying a programming pulse to each of the memory cells;

performing an under-programming verification operation on each one of the memory cells to determine which of the memory cells are under-programmed relative to its respective desired state, wherein the step of performing an under-programming verification operation on each memory cell further comprises determining a first threshold voltage range which includes a threshold voltage corresponding to the desired state of the memory cell;

generating a first bit set representing the determined first threshold voltage range; and comparing the generated first bit set to data intended to be programmed into the memory cell, wherein the generated first bit set and data successfully compare when the memory cell is not under-programmed;

repeating the steps of applying a programming pulse to and performing the under-programming verification operation on those memory cells which are under-programmed, until none of the memory cells are under-programmed; and performing an over-programming verification operation on each one of the memory cells to determine which of the memory cells are over-programmed relative to its respective desired state.

6. The method of claim 5, wherein the step of performing an under-programming verification operation on each memory cell further comprises:

performing an over-program detection operation to determine if the memory cell has been over-programmed relative to the desired state.

7. The method of claim 5, wherein the step of performing an over-programming verification operation on each memory cell further comprises:

determining a second threshold voltage range which includes a threshold voltage corresponding to the desired state of the memory cell;

generating a second bit set representing the determined second threshold voltage range; and comparing the generated second bit set to data intended to be programmed into the memory cell, wherein the generated second bit set and data successfully compare when the memory cell is not over-programmed.

8. The method of claim 7, wherein the step of performing an over-programming verification operation on each memory cell further comprises:

performing an over-program detection operation to determine if the memory cell has been over-programmed relative to the desired state.

9. The method of claim 1, wherein the step of applying a programming pulse to the memory cell further comprises:

applying a programming pulse of sufficient amplitude and duration to program the memory cell from a first one of the multiple states to a second one of the multiple states.

10. The method of claim 5, wherein the step of applying a programming pulse to each of the memory cells further comprises:

applying a programming pulse of sufficient amplitude and duration to program each of the memory cells from a first one of the multiple states to a second one of the multiple states.

11. The method of claim 9, wherein the second one of the multiple states is the state corresponding to the next highest threshold voltage above the first one of the states.

12. The method of claim 9, wherein the first one of the multiple states is the state corresponding to the lowest threshold voltage.

13. The method of claim 10, wherein the second one of the multiple states is the state corresponding to the next highest threshold voltage above the first one of the states.

14. The method of claim 10, wherein the first one of the multiple states is the state corresponding to the lowest threshold voltage.

15. The method of claim 1, wherein the step of applying a programming pulse to the memory cell further comprises:

applying a plurality of programming pulses, each of sufficient amplitude and duration, to program the memory cell from a first one of the multiple states to a second one of the multiple states.

16. The method of claim 15, wherein the second one of the multiple states is the state corresponding to the next highest threshold voltage above the first one of the states.

17. The method of claim 15, wherein the first one of the multiple states is the state corresponding to the lowest threshold voltage.

18. The method of claim 15, wherein the plurality of programming pulses includes a first pulse and a second pulse, and further, wherein the first pulse is of sufficient amplitude and duration to program the memory cell from the first one of the multiple states to a threshold voltage level approximately equal to, but less than that corresponding to the second of the multiple states.

19. The method of claim 5, wherein the step of applying a programming pulse to each of the memory cells further comprises:

applying a plurality of programming pulses, each of sufficient amplitude and duration, to program each of the memory cells from a first one of the multiple states to a second one of the multiple states.

20. The method of claim 19, wherein the second one of the multiple states is the state corresponding to the next highest threshold voltage above the first one of the states.

21. The method of claim 19, wherein the first one of the multiple states is the state corresponding to the lowest threshold voltage.

22. The method of claim 19, wherein the plurality of programming pulses includes a first pulse and a second pulse, and further, wherein the first pulse is of sufficient amplitude and duration to program the memory cell from the first one of the multiple states to a threshold voltage level approximately equal to, but less than that corresponding to the second of the multiple states.

23. A method of programming a multistate memory cell to a desired state, comprising:

applying a programming pulse to the memory cell;

performing an under-programming verification operation on the memory cell to determine if the cell is under-programmed relative to the desired state, wherein the step of performing an under-programming verification operation on the memory cell further comprises determining a first threshold voltage range which includes a threshold voltage corresponding to the desired state of the memory cell;

generating a first bit set representing the determined first threshold voltage range; and comparing the generated first bit set to data intended to be programmed into the memory cell, wherein the generated first bit set and data successfully compare when the memory cell is not under-programmed;

performing an over-programming verification operation on the memory cell to determine if the memory cell is over-programmed relative to the desired state; and repeating the previous steps of applying a programming pulse to the memory cell and performing the under-programming verification and over-programming operations.

24. The method of claim 23, wherein the step of performing an under-programming verification operation on the memory cell further comprises:

performing an over-program detection operation to determine if the memory cell has been over-programmed relative to the desired state.

25. The method of claim 23, wherein the step of performing an over-programming verification operation on the memory cell further comprises:

determining a second threshold voltage range which includes a threshold voltage corresponding to the desired state of the memory cell;

generating a second bit set representing the determined second threshold voltage range; and comparing the generated second bit set to data intended to be programmed into the memory cell, wherein the generated second bit set and data successfully compare when the memory cell is not over-programmed.

26. The method of claim 25, wherein the step of performing an over-programming verification operation on the memory cell further comprises:

performing an over-program detection operation to determine if the memory cell has been over-programmed relative to the desired state.

27. A method of programming a plurality of multistate memory cells to a respective plurality of desired states, comprising:

applying a programming pulse to each of the memory cells;

performing an under-programming verification operation on each one of the memory cells to determine which of the memory cells are under-programmed relative to its respective desired state, wherein the step of performing an under-programming verification operation on each memory cell further comprises determining, substantially simultaneously, a plurality of threshold voltage ranges corresponding to the plurality of desired states of the memory cells;

generating, substantially simultaneously, a plurality of bit sets corresponding to the determined threshold voltage ranges; and comparing, substantially simultaneously, the generated bit sets to data intended to be programmed into the memory cell;

repeating the steps of applying a programming pulse to and performing the under-programming verification operation on those memory cells which are under-programmed, until none of the memory cells are under-programmed; and performing an over-programming verification operation on each one of the memory cells to determine which of the memory cells are over-programmed relative to its respective desired state.

28. The method of claim 27, wherein the step of performing an under-programming verification operation on each memory cell further comprises:

performing an over-program detection operation to determine if the memory cell has been over-programmed relative to the desired state.

29. The method of claim 27, wherein the step of performing an over-programming verification operation on each memory cell further comprises:

determining an over-programming threshold voltage range which includes a threshold voltage corresponding to the desired state of the memory cell;

generating a bit set representing the determined over-programming threshold voltage range; and comparing the generated bit set to data intended to be programmed into the memory cell, wherein the generated bit set and data successfully compare when the memory cell is not over-programmed.

30. The method of claim 29, wherein the step of performing an over-programming verification operation on each memory cell further comprises:

performing an over-program detection operation to determine if the memory cell has been over-programmed relative to the desired state.

31. The method of claim 27, wherein the step of applying a programming pulse to each of the memory cells further comprises:

applying a programming pulse of sufficient amplitude and duration to program each of the memory cells from a first one of the multiple states to a second one of the multiple states.

32. The method of claim 31, wherein the second one of the multiple states is the state corresponding to the next highest threshold voltage above the first one of the states.

33. The method of claim 31, wherein the first one of the multiple states is the state corresponding to the lowest threshold voltage.

34. The method of claim 27, wherein the step of applying a programming pulse to each of the memory cells further comprises:

applying a plurality of programming pulses, each of sufficient amplitude and duration, to program each of the memory cells from a first one of the multiple states to a second one of the multiple states.

35. The method of claim 34, wherein the second one of the multiple states is the state corresponding to the next highest threshold voltage above the first one of the states.

36. The method of claim 34, wherein the first one of the multiple states is the state corresponding to the lowest threshold voltage.

37. The method of claim 34, wherein the plurality of programming pulses includes a first pulse and a second pulse, and, further, wherein the first pulse is of sufficient amplitude and duration to program the memory cell from the first one of the multiple states to a threshold voltage level approximately equal to, but less than that corresponding to the second of the multiple states.

38. The method of claim 27, wherein the plurality of threshold voltage ranges are contiguous, so that an upper limit of a first threshold voltage range is equal to a lower limit of a next highest threshold voltage range.

* * * * *